(12) United States Patent
Thacker et al.

(10) Patent No.: US 8,975,754 B2
(45) Date of Patent: Mar. 10, 2015

(54) CHIP PACKAGE FOR HIGH-COUNT CHIP STACKS

(71) Applicant: Oracle International Corporation, Redwood City, CA (US)

(72) Inventors: Hiren D. Thacker, San Diego, CA (US); John E. Cunningham, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 70 days.

(21) Appl. No.: 13/764,331

(22) Filed: Feb. 11, 2013

(65) Prior Publication Data

US 2014/0225273 A1  Aug. 14, 2014

(51) Int. Cl.
*H01L 23/52* (2006.01)
*H01L 21/77* (2006.01)
*H01L 21/52* (2006.01)
*H01L 23/538* (2006.01)
*H01L 21/02* (2006.01)

(52) U.S. Cl.
CPC ...... *H01L 23/5384* (2013.01); *H01L 21/02697* (2013.01); *H01L 2224/16225* (2013.01); *H01L 2924/0002* (2013.01)
USPC .......... 257/777; 257/618; 257/621; 257/730; 257/E25.006; 439/109

(58) Field of Classification Search
USPC .......... 257/618, 621, 686, 730, 777, E25.006, 257/E25.021, E25.027, E23.085; 438/109, 438/FOR. 368, FOR. 426
See application file for complete search history.

(56) References Cited

U.S. PATENT DOCUMENTS

| 6,538,333 B2 * | 3/2003 | Kong ............................ 257/777 |
| 7,875,499 B2 * | 1/2011 | Yamano ....................... 438/109 |
| 2011/0033978 A1 * | 2/2011 | Oh ................................ 438/109 |

* cited by examiner

*Primary Examiner* — Jasmine Clark
(74) *Attorney, Agent, or Firm* — Park, Vaughan, Fleming & Dowler LLP; Steven E. Stupp

(57) ABSTRACT

A chip package is described. This chip package includes a substrate having a side at an angle relative to the top and bottom surfaces of the substrate that is between that of a direction parallel to the top and bottom surfaces and that of a direction perpendicular to the top and bottom surfaces (i.e., between 0° and 90°). This side may be configured to couple to a stack of semiconductor dies in which the semiconductor dies are offset from each other in a direction parallel to the top and bottom surfaces so that one side of the stack defines a stepped terrace. For example, the side may include electrical pads. These electrical pads may be coupled to electrical pads on the top surface by through-substrate vias (TSVs) in the substrate. Moreover, the electrical pads on the top surface may be configured to couple to an integrated circuit.

20 Claims, 11 Drawing Sheets

CHIP PACKAGE FOR HIGH-COUNT CHIP STACKS

BACKGROUND

1. Field

The present disclosure generally relates to a semiconductor chip package. More specifically, the present disclosure relates to a chip package that facilitates assembly and integration of a group of chips arranged in a stack.

2. Related Art

Chip packages that include stacked semiconductor chips can provide higher performance and lower cost in comparison to conventional individually packaged chips that are connected to a printed circuit board. These chip packages also provide certain advantages, such as the ability to: use different processes on different chips in the stack, combine higher density logic and memory, and transfer data using less power. For example, a stack of chips that implements a dynamic random access memory (DRAM) can use a high-metal-layer-count, high-performance logic process in a base chip to implement input/output (I/O) and controller functions, and a set of lower metal-layer-count, DRAM-specialized processed chips can be used for the rest of the stack. In this way the combined set of chips may have better performance and lower cost than: a single chip that includes I/O and controller functions manufactured using the DRAM process; a single chip that includes memory circuits manufactured using a logic process; and/or attempting to use a single process to make both logic and memory physical structures.

One approach for stacking chips involves a chip package in which the chips in a stack are offset from each other, thereby defining a terrace with exposed pads. A high-bandwidth ramp component, which is positioned approximately parallel to the terrace, electrically couples to the exposed pads. While the chip package can provide high inter-component communication bandwidth and high component density, it can be difficult to position the ramp component along the terrace and, thus, to fabricate the chip package. This difficulty can reduce the yield and increase the cost of the chip package.

Hence, what is needed is a chip package that offers the advantages of stacked chips without the problems described above.

SUMMARY

One embodiment of the present disclosure provides a chip package that includes a substrate having a first surface, a second surface and a side, where the first surface and the second surface are substantially parallel, and where the side is at an angle relative to a plane of the first surface that is between that of a direction parallel to the first surface and less than that of a direction perpendicular to the first surface (i.e., between 0° and 90°). Moreover, first electrical pads are disposed on the first surface and second electrical pads are disposed on the side. Furthermore, through-substrate vias (TSVs) electrically couple the first electrical pads and the second electrical pads, where a given TSV electrically couples a given one of the first electrical pads and a given one of the second electrical pads. Note that the second electrical pads are configured to electrically couple to a set of semiconductor dies arranged in a stack in a direction which is substantially perpendicular to the first surface. Additionally, the semiconductor dies in the set of semiconductor dies are offset from each other in a horizontal direction in the plane of the first surface so that one side of the stack defines a stepped terrace.

In some embodiments, the side includes discrete vertical steps corresponding to the stepped terrace.

Moreover, the TSVs may be included in dicing lanes of a wafer that includes the substrate.

Furthermore, the substrate may include a cavity, defined by an edge, that is configured to partially surround the set of semiconductor dies.

Note that the substrate may include a material such as: glass, a plastic, silicon and/or a ceramic.

In some embodiments, the first electrical pads are configured to electrically couple to a circuit board or an integrated circuit.

Additionally, the angle may be fabricated using machining and/or etching.

Another embodiment provides a system that includes the chip package and the set of semiconductor dies arranged in the stack in the direction. In this system, the semiconductor dies may be electrically coupled to the second electrical pads by: solder, microsprings, and/or an anisotropic conducting film.

Another embodiment provides a method for fabricating a chip package. During this method, the side of the substrate is defined relative to the first surface and the second surface of the substrate, where the first surface and the second surface are substantially parallel, and where the side is at an angle relative to a plane of the first surface that is between that of a direction parallel to the first surface and less than that of a direction perpendicular to the first surface (i.e., between 0° and 90°). Then, TSVs are defined in the substrate between the first surface and the side. Moreover, the first electrical pads are disposed on the first surface, where the first electrical pads are electrically coupled to the TSVs. Furthermore, the second electrical pads are disposed on the side, where the second electrical pads are electrically coupled to the TSVs. Note that the given TSV electrically couples the given one of the first electrical pads and the given one of the second electrical pads. Additionally, the second electrical pads are configured to electrically couple to the set of semiconductor dies arranged in the stack in the direction which is substantially perpendicular to the first surface. The semiconductor dies in the set of semiconductor dies are offset from each other in the horizontal direction in the plane of the first surface so that one side of the stack defines the stepped terrace.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a chip package, a system that includes the chip package, and a method for fabricating the chip package are described. This chip package includes a substrate having a side at an angle relative to the top and bottom surfaces of the substrate that is between that of a direction parallel to the top and bottom surfaces and that of a direction perpendicular to the top and bottom surfaces (i.e., between 0° and) 90°. This side may be configured to couple to a stack of semiconductor dies in which the semiconductor dies are offset from each other in a direction parallel to the top and bottom surfaces so that one side of the stack defines a stepped terrace. For example, the side may include electrical pads. These electrical pads may be coupled to electrical pads on the top surface by through-substrate vias (TSVs) in the substrate. Moreover, the electrical pads on the top surface may be configured to couple to an integrated circuit.

In this way, the chip package may facilitate assembly and integration of the stack of semiconductor dies. Furthermore, the chip package may provide low latency and high inter-component communication bandwidth between components in the stack without the use of a ramp component parallel to the stepped terrace. This chip package may increase mechanical stability while reducing the risk of mechanical damage. Thus, the chip package may be fabricated with high yield and low cost.

Figure 1:
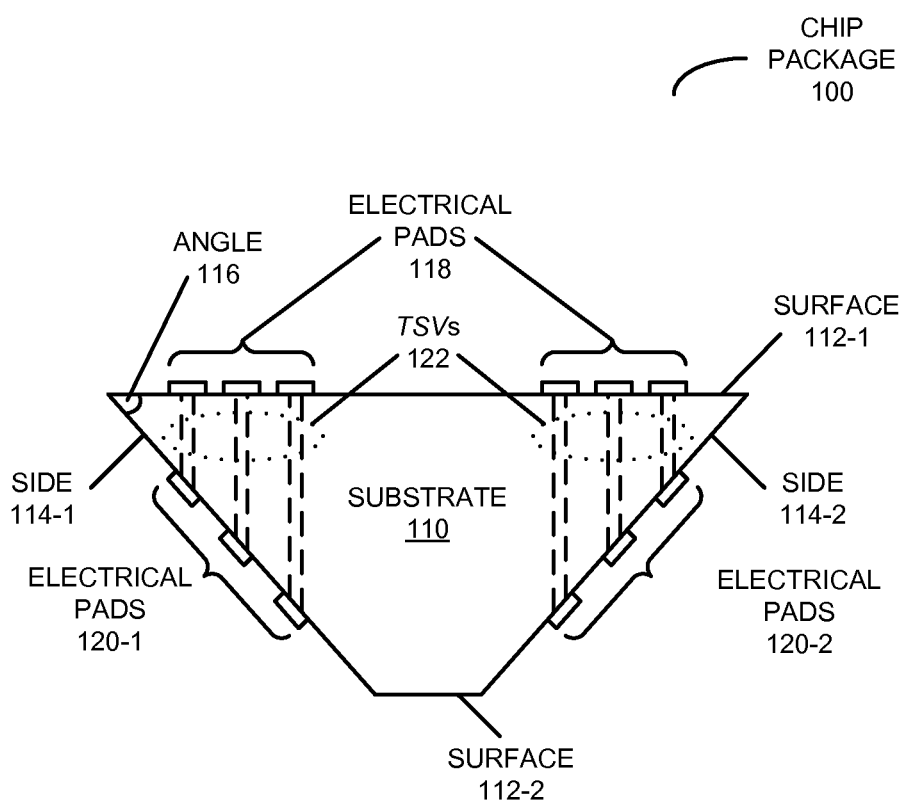
FIG. 1 is a block diagram illustrating a chip package in accordance with an embodiment of the present disclosure.

We now describe embodiments of a chip package. FIG. 1 presents a block diagram illustrating a chip package 100. This chip package includes a substrate 110 (which is sometimes referred to as an 'interposer') having surfaces 112 and sides 114 (or slanted sidewall edges), where surfaces 112 are substantially parallel, and at least one of sides 114 (such as side 114-1) is at an angle 116 relative to a plane of surface 112-1 that is between that of a direction parallel to surface 112-1 and that of a direction perpendicular to surface 112-1 (i.e., between 0° and 90°). Moreover, electrical pads 118 are disposed on surface 112-1 and electrical pads (such as electrical pads 120-1) are disposed at different vertical positions on at least one of sides (such as side 114-1). For example, electrical pads 120 may have a pitch along a vertical direction (perpendicular to surface 112-1) of 50-200 µm (which, as described below with reference to FIG. 2, corresponds to a vertical pitch of semiconductor dies or chips in a ramp stack), and a horizontal pitch (into the plane of FIG. 1) of 50-300 µm (which, as described below with reference to FIG. 2, matches the pitch along rows of input/output electrical pads on the semiconductor dies in the ramp stack). Furthermore, through-substrate vias (TSVs) 122 electrically couple electrical pads 118 and 120, where a given TSV electrically couples a given one or a subset of electrical pads 118 and a given one or a subset of electrical pads 120.

Chip package 100 is specifically designed to mechanically and electrically house a high chip-count stack of semiconductor dies or chips (which is sometimes referred to as a 'ramp stack'). Moreover, chip package 100 facilitates the integration and assembly of a chip stack (such as a high chip-count memory stack) in close proximity to one or more microprocessors, and thus provides low latency and high communication bandwidth between the processor and memory. As described further below with reference to FIG. 10, chip package 100 is also scalable and can accept several memory chip stacks per processor on a single substrate.

Figure 2:
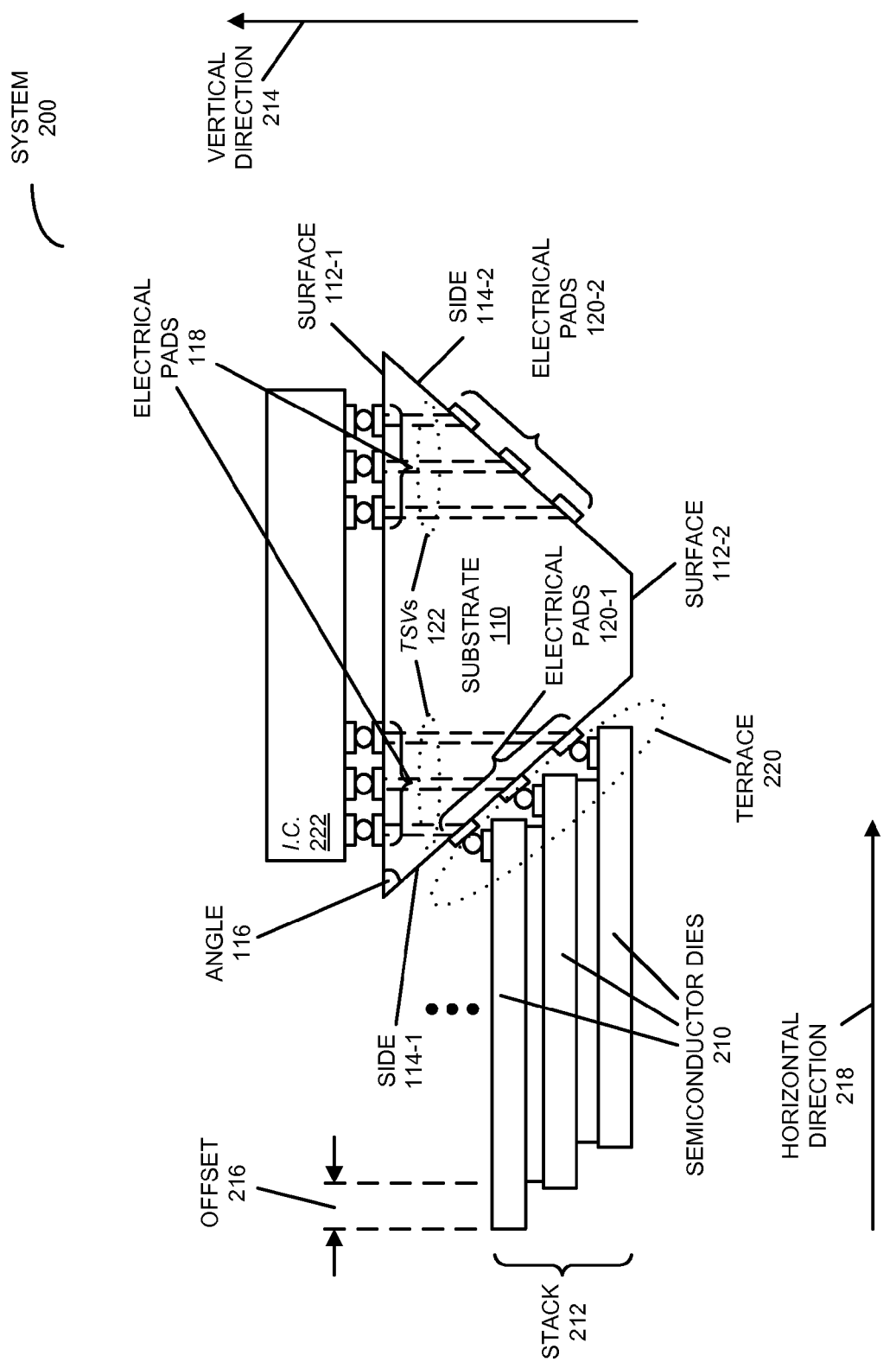
FIG. 2 is a block diagram illustrating a side view of a system that includes the chip package of FIG. 1 in accordance with an embodiment of the present disclosure.

A system 200 that includes chip package 100 (FIG. 1) is shown in FIG. 2. In this system, electrical pads 120-1 are configured to electrically couple to a set of semiconductor dies 210 arranged in a stack 212 in a vertical direction 214, which is substantially perpendicular to surface 112-1. (This stack is sometimes referred to as a 'ramp stack.') Moreover, the chip package aligns semiconductor dies 210 so that electrical pads on semiconductor dies 210 match positions of electrical pads 120-1, and provides structural integrity under temperature and humidity variation. Note that semiconductor dies 210 are offset from each other by at least a minimum offset 216 in a horizontal direction 218 in the plane of surface 112-1 so that one of the sides of stack 212 defines a stepped terrace 220. In some embodiments, semiconductor dies 210 may provide silicon area that supports logic and/or memory functionality.

In some embodiments, electrical pads 118 are configured to electrically couple to an integrated circuit (I.C.) 222 (such as a processor or an application-specific integrated circuit) or, alternatively, a circuit board, such as a printed circuit board (PCB). This configuration may not impede thermal access to integrated circuit 222. Note that electrical coupling between electrical pads 118 and integrated circuit 222 and/or electrical pads 120-1 and semiconductor dies 210 may include: solder (such as a reflowable solder layer), microsprings, wire bonds, and/or an anisotropic conducting film. For example, as illustrated in FIG. 2, a given semiconductor die containing a linear array of solder bump pads may be electrically coupled to one column of TSVs 122 on the slanted edge or side 114-1 of substrate 110. Additionally, semiconductor dies 210 may have a linear array of solder bumps that can be electrically coupled to the two-dimensional array of metal-finished electrical pads 120-1 along the slanted edge or side 114-1 of substrate 110 (i.e., along vertical direction 214 and into the plane of FIG. 2).

More generally, semiconductor dies 210, the chip package, and/or integrated circuit (I.C.) 222 may communicate with each other using PxC of electromagnetically coupled signals (which is referred to as 'electromagnetic proximity communication'), such as capacitively coupled signals and/or proximity communication of optical signals (which are, respectively, referred to as 'electrical proximity communication' and 'optical proximity communication'). In some embodiments, the electromagnetic proximity communication includes inductively coupled signals and/or conductively coupled signals.

Therefore, the impedance associated with electrical contacts between semiconductor dies 210, the chip package, and/or integrated circuit 222 may be conductive (i.e., in-phase) and/or capacitive (i.e., out-of-phase), such as when there is a passivation layer (e.g., a glass layer) above metal pads on or proximate to surfaces of semiconductor dies 210. In general, the impedance may be complex, which includes an in-phase component and an out-of-phase component. Regardless of the electrical contact mechanism (such as microsprings, an anisotropic layer or solder), if the impedance associated with the contacts is conductive, conventional transmit and receive input/output (I/O) circuits may be used in components in the chip package. However, for contacts having a complex (and, possibly, variable) impedance, the transmit and receive I/O circuits may include one or more embodiments described in U.S. patent application Ser. No. 12/425,871, entitled "Receive Circuit for Connectors with Variable Complex Impedance," by Robert J. Drost et al., filed on Apr. 17, 2009, the contents of which are hereby incorporated herein by reference.

Note that microsprings can be fabricated on a wide variety of surfaces, including: a PCB, an organic or ceramic integrated circuit, and/or on the surface of a semiconductor die. Moreover, microsprings can be fabricated with an areal density of inter-chip connections that exceeds the density of input/output signals on high-performance integrated circuits, and the compliance of microsprings can increase the tolerance to mechanical movement and misalignment of components in the chip package.

In some embodiments there may be two or more microspring geometries on a given semiconductor die. For example, data-signal microsprings may be short with blunt ends, while power-signal microsprings may be longer with sharper tips. In addition, by including redundant power-signal microsprings, yield and long-term reliability may be enhanced even if some number of the power-signal microsprings lose their connections.

In order to increase the capacitance of the contacts between the chip package and semiconductor dies 210, in some embodiments a conductive liquid, paste or film may be added to the contact area to fill in any gaps. This would also have the beneficial effect of increasing the area of overlap to the extent that the liquid, paste or film extends beyond the edges of the given microspring.

Microsprings can also provide mechanical and electrical contacts without the use of solder. Thus, the mechanical and/or the electrical coupling between the chip package and semiconductor dies 210 can be removable or remateable (i.e., these components can be remateably coupled), which facilitates rework of system 200 during and/or after assembly and test. Note that remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components that are designed to couple to each other (such as components that snap together). Thus, remateable components are components that are configured to allow remateable coupling to be established.

However, in some embodiments the mechanical and/or the electrical coupling between the chip package and semiconductor dies 210 is more permanent. For example, it may not be remateable, such as the solder contacts shown in FIG. 2. In these embodiments, electrical pads 120-1 may include underlayer metallization to be compatible with solder-based interconnects.

In the case of an anisotropic film, the anisotropic properties of the anisotropic film enhance electrical conductivity normal to the surface of the anisotropic film while also diminishing electrical conductivity tangential to the surface of the anisotropic film. As a result, the anisotropic film electrically couples mechanically aligned pads on opposite faces of the anisotropic film. For example, the anisotropic film may include the PariPoser® material (from Paricon Technologies, Inc., of Fall River, Mass.). In a PariPoser-type of anisotropic conductive elastomer film, small conductive balls are suspended in a silicone rubber such that the balls generally line up into columns and provide conduction normal, but not tangential, to the surfaces of anisotropic film. As with the microsprings, in general the impedance of the resulting electrical contacts may be conductive and/or capacitive. If the impedance is conductive, conventional transmit and receive I/O circuits may be used in components in the chip package. However, if the impedance is complex, the transmit and receive I/O circuits in the chip package may include one or more embodiments described in U.S. patent application Ser. No. 12/425,871.

Note that TSVs 122 in the chip package may be included in dicing lanes of a wafer that includes substrate 110. Furthermore, as described below with reference to FIGS. 3-5, angle 116 may be fabricated using machining and/or etching.

Substrate 110 may include a material such as: glass, a plastic, silicon and/or a ceramic. Thus, the chip package may be a passive component, such as a plastic substrate with metal traces and TSVs 122 to electrically couple to semiconductor dies 210. In particular, surface 112-1 may include at least one (and possibly several) layers of planar electrical redistribution layers to transfer signals, power and ground connections from TSVs 122 to an active integrated circuit or passive components. For example, substrate 110 may be fabricated using injection-molded plastic. Alternatively, substrate 110 may include a semiconductor die or glass with lithographically defined wires or signal lines and TSVs 122. Furthermore, substrate 110 may include dielectric layers to ensure electrical isolation between TSVs 122.

In embodiments where the chip package includes a semiconductor die, active devices, such as limit amplifiers, may be included to reduce cross-talk between the signal lines. Additionally, cross-talk may be reduced in either an active or a passive the chip package using differential signaling.

In some embodiments, the chip package includes transistors and wires that shuttle data and power signals among semiconductor dies 210 via electrical pads 120-1. For example, the chip package may include high-voltage signals, and these signals may be stepped down for use on semiconductor dies 210 using: a step-down regulator (such as a capacitor-to-capacitor step-down regulator), as well as capacitor and/or inductor discrete components to couple to semiconductor dies 210.

A thickness of substrate 110 in the chip package may depend on the size of the array of TSVs 122, e.g., the number of rows of TSVs 122 that correspond to the number of semiconductor dies 210 in stack 212. For example, the thickness may be a couple of hundred microns for a 4-chip stack or as large as five millimeters for a 40-chip stack. In some embodiments, stack 212 includes up to 80 semiconductor dies. Moreover, semiconductor dies 210 may each have a thickness of 100 μm.

In an exemplary embodiment, angle 116 is 45°. More generally, angle 116 is determined by minimum offset 216 of semiconductor dies 210, the thickness of semiconductor dies 210, and a height of electrical pads 120 (such as a height of solder balls on electrical pads 120).

By electrically coupling semiconductor dies 210 to the chip package, this interconnection technique can avoid the use of a planar ramp component parallel to angle 116, thereby increasing the yield and reducing the cost of system 200. Instead, surfaces 112 of substrate 110 (which provides the functions of a ramp component) are parallel to surfaces of semiconductor dies 210.

Figure 3:
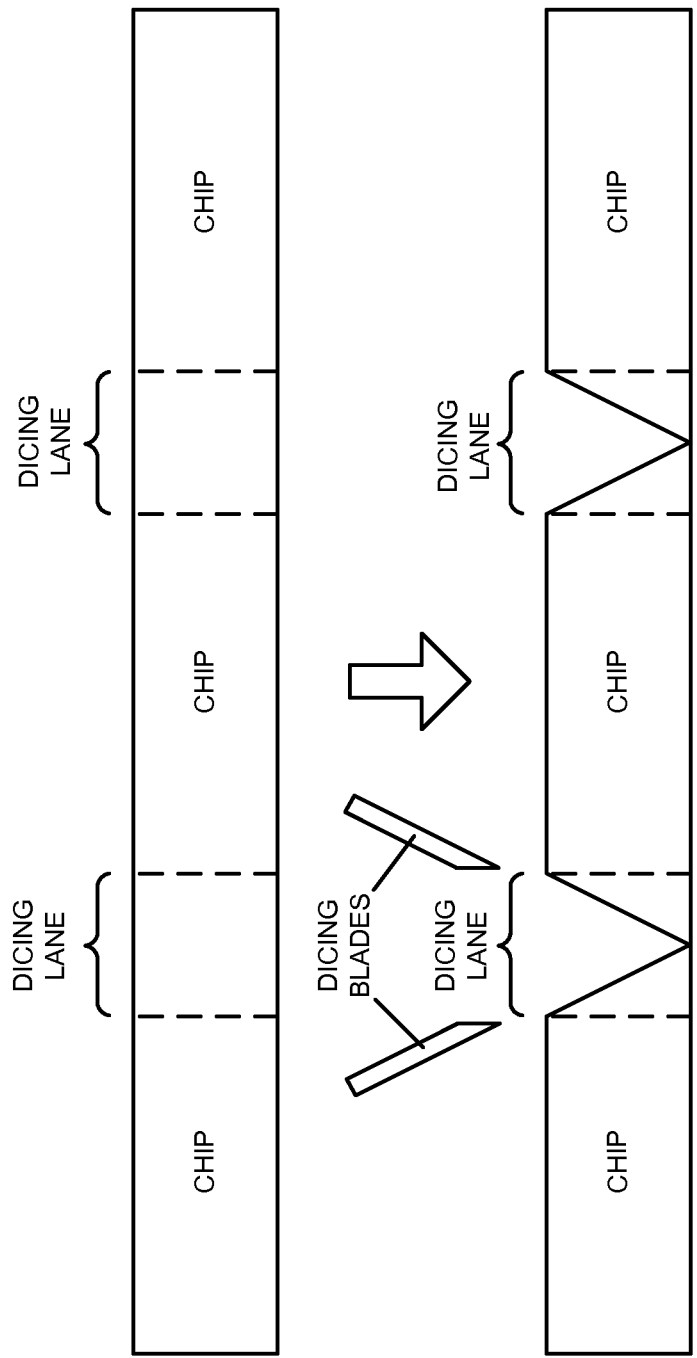
FIG. 3 is a flow chart illustrating fabrication of the chip package of FIG. 1 in accordance with an embodiment of the present disclosure.

We now describe techniques for fabricating the chip package. As shown in FIG. 3, which presents a flow chart illustrating fabrication of chip package 100 (FIG. 1), one approach for fabricating the chip package is to build an array of TSVs along the sides or edges of a normal planar substrate (for example, in the dicing lanes), and then to machine the sides of the substrate to create an angled edge where the machining process reveals each row of TSVs at a different vertical height. In particular, saws with dicing blades at two angles with respect to the substrate may be used to make cuts through a redistribution (or a dielectric) layer and the substrate to define sides with slanted sidewall edges and to singulate chips. (However, in this and other embodiments, the sides may be defined before the redistribution layer is disposed on the top surface of the substrate.) Note that the TSVs in each row are at the same height. Moreover, the slanted sidewall edges may be fabricated by dicing the finished substrate at a desired angle and then polishing to achieve a smooth surface.

After the chips have been separated from the wafer, the slanted sidewall edges may be polished and electroless plating may be used to define electrical pads 120 (FIGS. 1 and 2) on the exposed sides.

Figure 4:
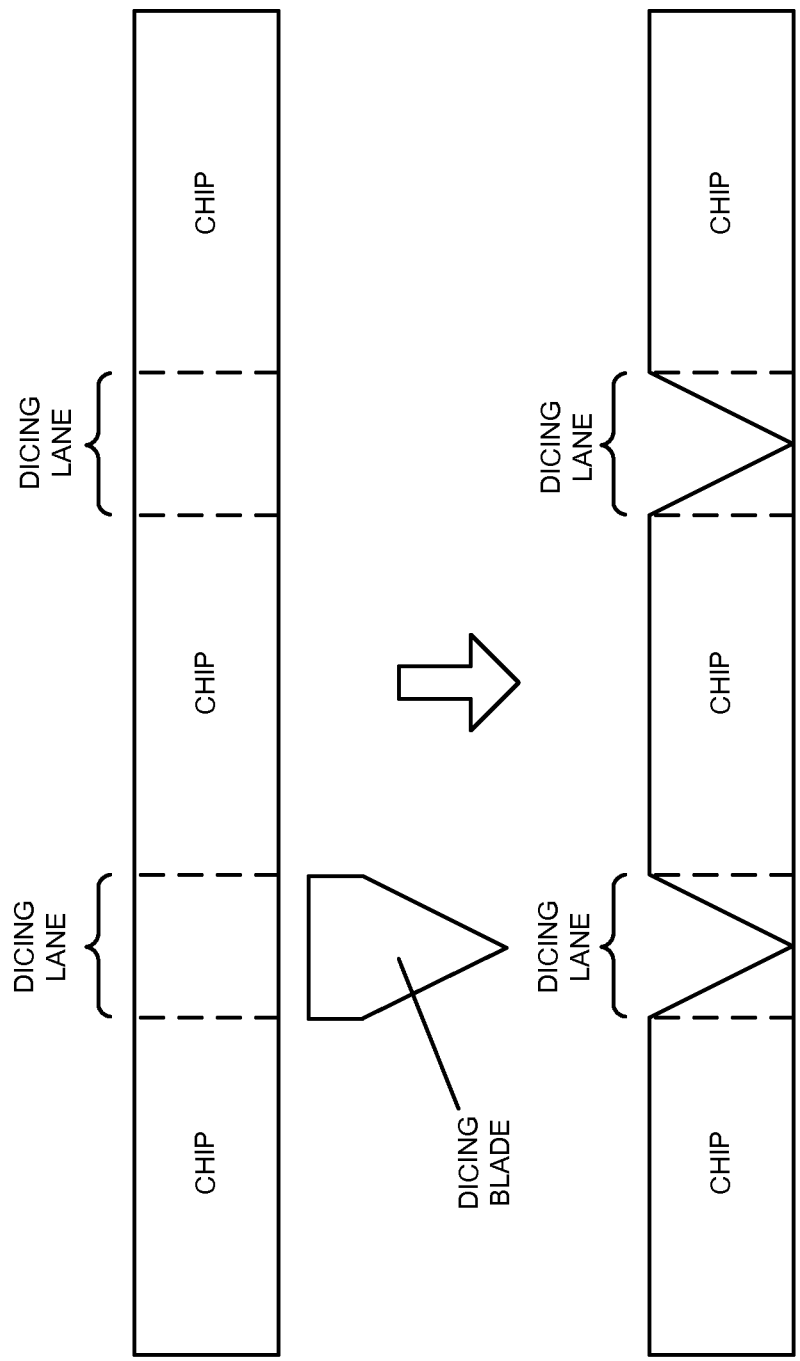
FIG. 4 is a flow chart illustrating fabrication of the chip package of FIG. 1 in accordance with an embodiment of the present disclosure.

Alternatively, as shown in FIG. 4, which presents a flow chart illustrating fabrication of chip package 100 (FIG. 1), the slanted sidewall edges may be fabricated by dicing vertically with a dicing blade having two angled edges and mechanically grinding and polishing the sides of the substrate to achieve the desired angle. The exposed TSVs may then be post-processed to add a suitable metal stack (i.e., electrical pads 120 in FIGS. 1 and 2) to enable bonding with a "ramp-stack" style multi-chip stack. For example, electroless plating may be used.

Figure 5:
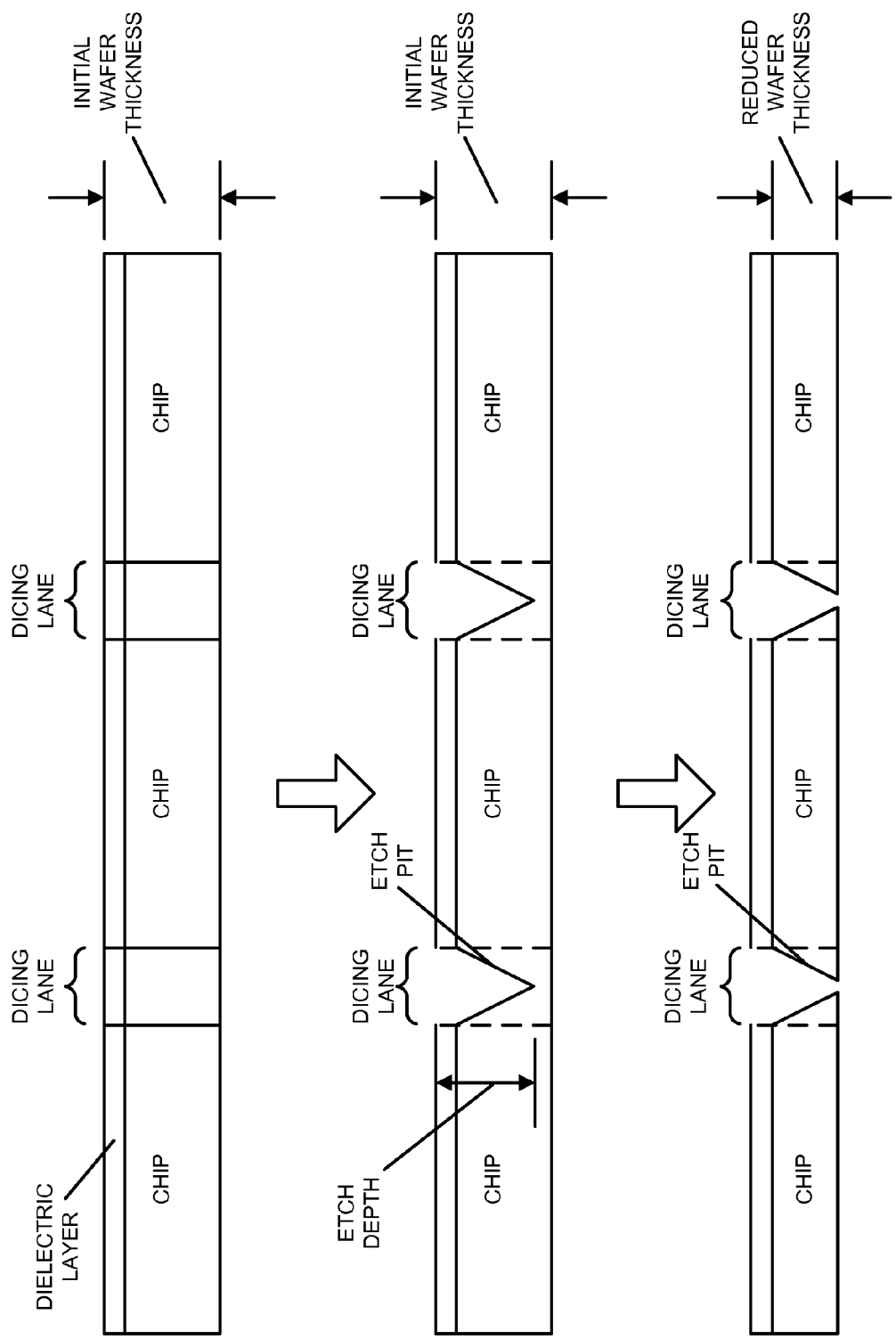
FIG. 5 is a flow chart illustrating fabrication of the chip package of FIG. 1 in accordance with an embodiment of the present disclosure.

If a silicon substrate is used, then it may be possible to create the slanted sidewall edges using an anisotropic etching process followed by thinning the wafer from the backside to separate the chips (which is sometimes referred to as a 'pit-and-thin' technique). This is illustrated in FIG. 5, which presents a flow chart illustrating fabrication of chip package 100 (FIG. 1). In this fabrication technique, etch pits having a depth that is less than the wafer thickness are defined using an anisotropic etch through the redistribution layer on the top surface. Then, the wafer may be flipped over and TSVs may be defined in the dicing lanes. These TSVs may be filled with metal and electrical pads 120 (FIGS. 1 and 2) may be disposed on the slanted sidewall edges using electroplating.

Then, the wafer may be bonded to a carrier (not shown) and the wafer may be thinned from the backside to singulate the chips. After depositing a redistribution layer on the backside of the substrate, the chips may be separated from the carrier.

Figure 6:
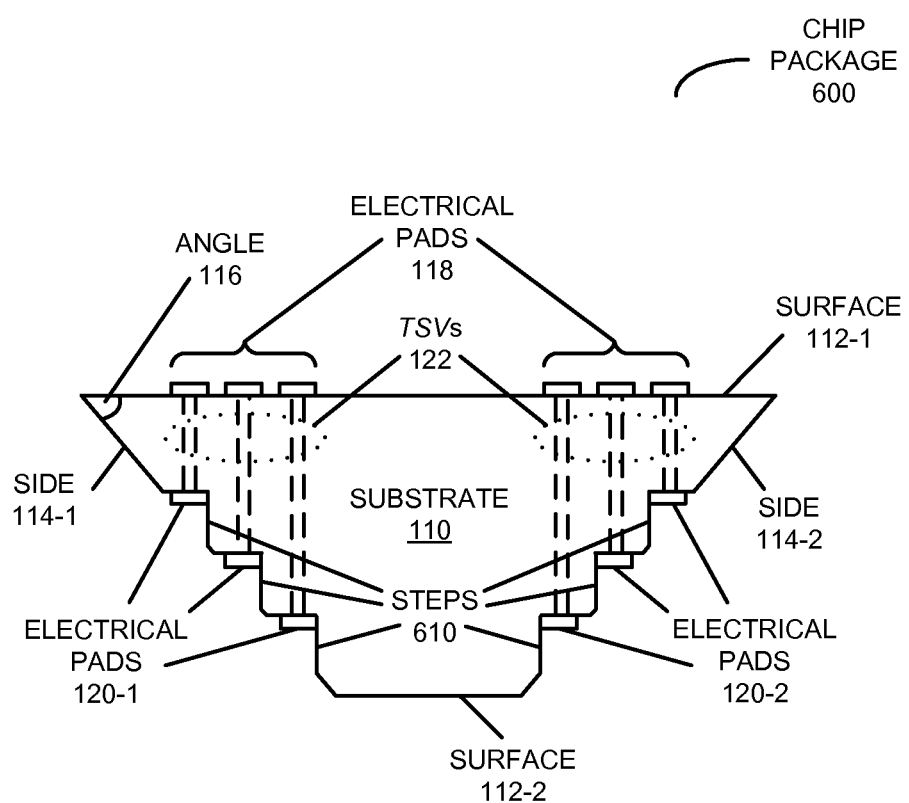
FIG. 6 is a block diagram illustrating a chip package in accordance with an embodiment of the present disclosure.

As shown in FIG. 6, which presents a block diagram illustrating a chip package 600, in another embodiment of the chip package, at least one of sides 114 (such as side 114-1) of substrate 110 is micro-machined to have discrete vertical steps 610 corresponding to stepped terrace 220 (FIG. 2), with an array of electrical pads 120-1 (into the plane of FIG. 6) and TSVs 122 at each step.

The number and pitch of TSVs 122 at each of vertical steps 610 may correspond to the pattern of the electrical pads on the corresponding semiconductor die in stack 212 (FIG. 2). Note that TSVs 122 may be processed to have a metal finish to allow formation of a solder joint with a matching semiconductor die. However, other TSVs and planar redistribution layers on surfaces 112 and/or sides 114 may be designed and fabricated as needed for distribution of signal, power and ground. In a given chip-package design, the height of each of vertical steps 610 may be the same as the vertical pitch between semiconductor dies 210 (FIG. 2) in stack 212 (FIG. 2). Similarly, the horizontal separation between columns of TSVs 122 on substrate 110 may be the same as offset 216 (FIG. 2) of electrical pads on adjacent semiconductor dies 210 in stack 212.

Figure 7:
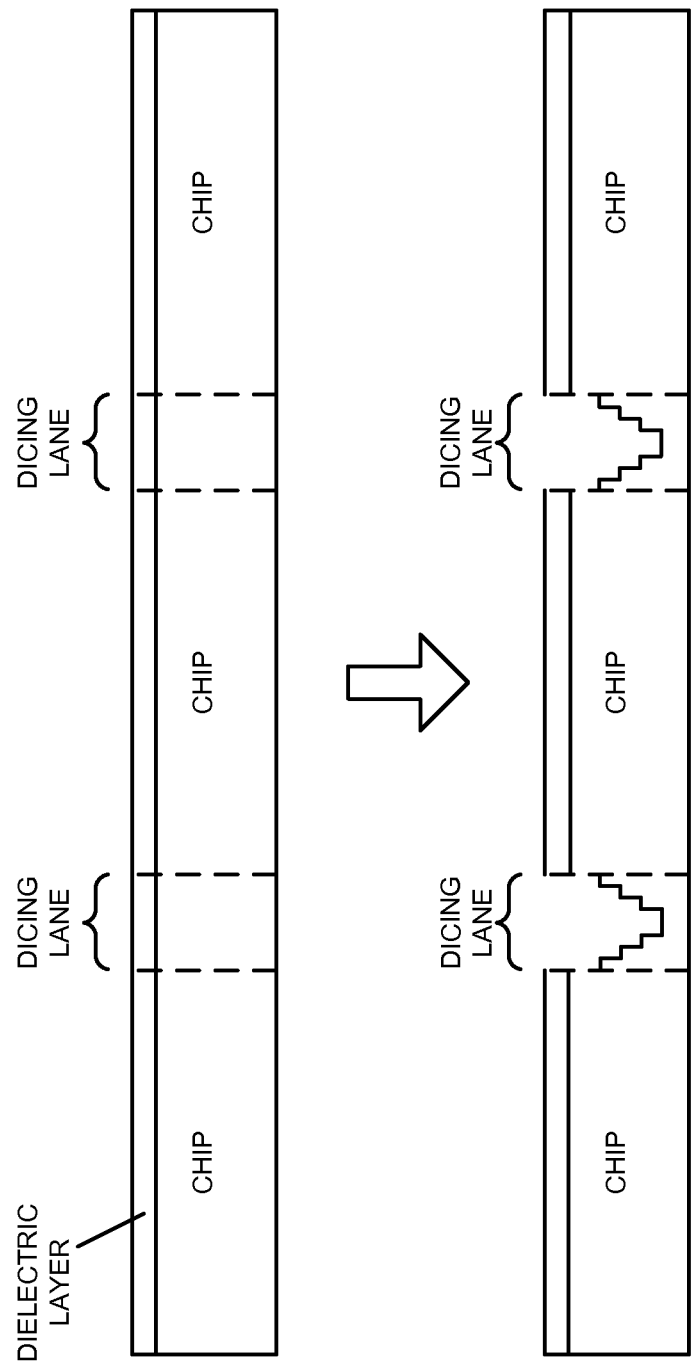
FIG. 7 is a flow chart illustrating fabrication of the chip package of FIG. 6 in accordance with an embodiment of the present disclosure.

We now describe techniques for fabricating chip package 600. Chip package 600 can be fabricated using a post-substrate fabrication machining process. For example, a two-dimensional array of TSVs may be fabricated around the periphery of each substrate (for example, in the dicing lanes of a wafer). Following this operation, a milling tool may be used to precisely form discrete vertical steps 610 (FIG. 6) through the redistribution layer and the substrate along each linear array of TSVs. The substrates can then be further processed to form a solder-able finish (for example, electroless plating may be used to define electrical pads 120 in FIG. 6). Then, the wafer may be diced to singulate the chips. This fabrication technique is illustrated in FIG. 7, which presents a flow chart illustrating fabrication of chip package 600 (FIG. 6).

Figure 8:
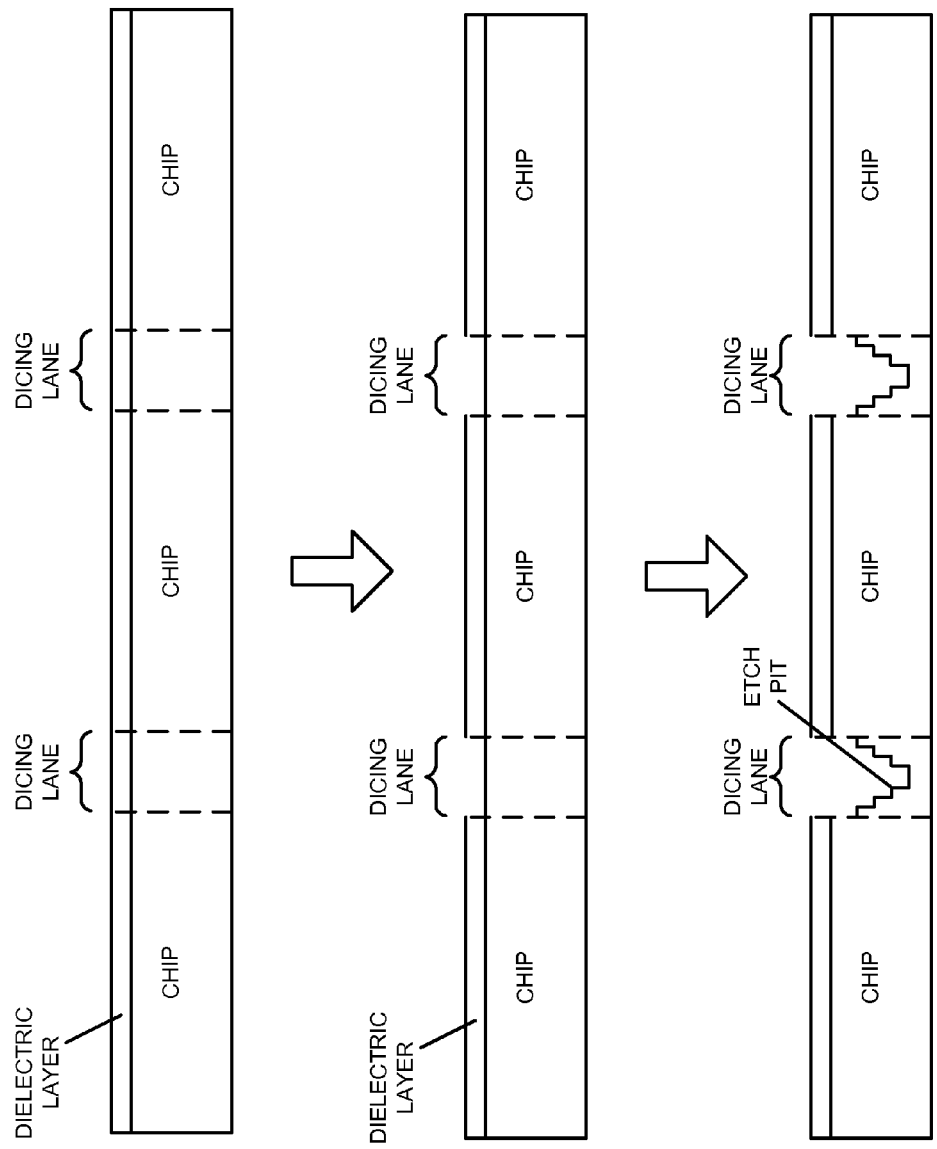
FIG. 8 is a flow chart illustrating fabrication of the chip package of FIG. 6 in accordance with an embodiment of the present disclosure.

Alternatively, as shown in FIG. 8, which presents a flow chart illustrating fabrication of chip package 600 (FIG. 6), a lithography-based process may be used to fabricate discrete vertical steps 610 (FIG. 6). In particular, regions in the front-side or top surface redistribution layer may be cleared. Then, photolithography may be used to form the stairstep features. For example, multiple photo-masks may be used. Next, the TSVs may be patterned on the bottom surface, etched through the substrate, and filled with metal. Moreover, electroless plating may be used to define electrical pads 120 (FIG. 6). Furthermore, the wafer may be diced to singulate the chips.

This fabrication technique may be particularly useful if substrate 110 (FIG. 1) includes a photo-imageable glass. While a typical photolithographic process uses binary masks containing regions where light from the lithography system is either blocked or allowed to pass through, a grayscale photo-mask can allow different amounts of light to pass through. As a consequence, materials exposed through the different shades of gray on the photo-mask are exposed and cross-linked to different extents. In turn, these materials dissolve to different depths using the same developer or etchant. In this way, a stairstep structure can be fabricated, where the number of vertical steps possible is controlled by the resolution capability in the grayscale photo-mask and the grayscale photolithography-based process. Note that grayscale photolithography may also be performed on non-photo-imageable substrates (such as glass or silicon).

As was the case in the embodiment illustrated in FIG. 2, one column of finished TSVs on one of vertical steps 610 in chip package 600 (FIG. 6) can be attached to a linear array of C4 or copper-pillar bumps on a semiconductor die. Additionally, a stack of semiconductor dies, each of which may have a linear array of solder bumps, may be attached to a two-dimensional array of metal-finished TSV interconnects in electrical pads 120-1 (FIG. 6).

Figure 9:
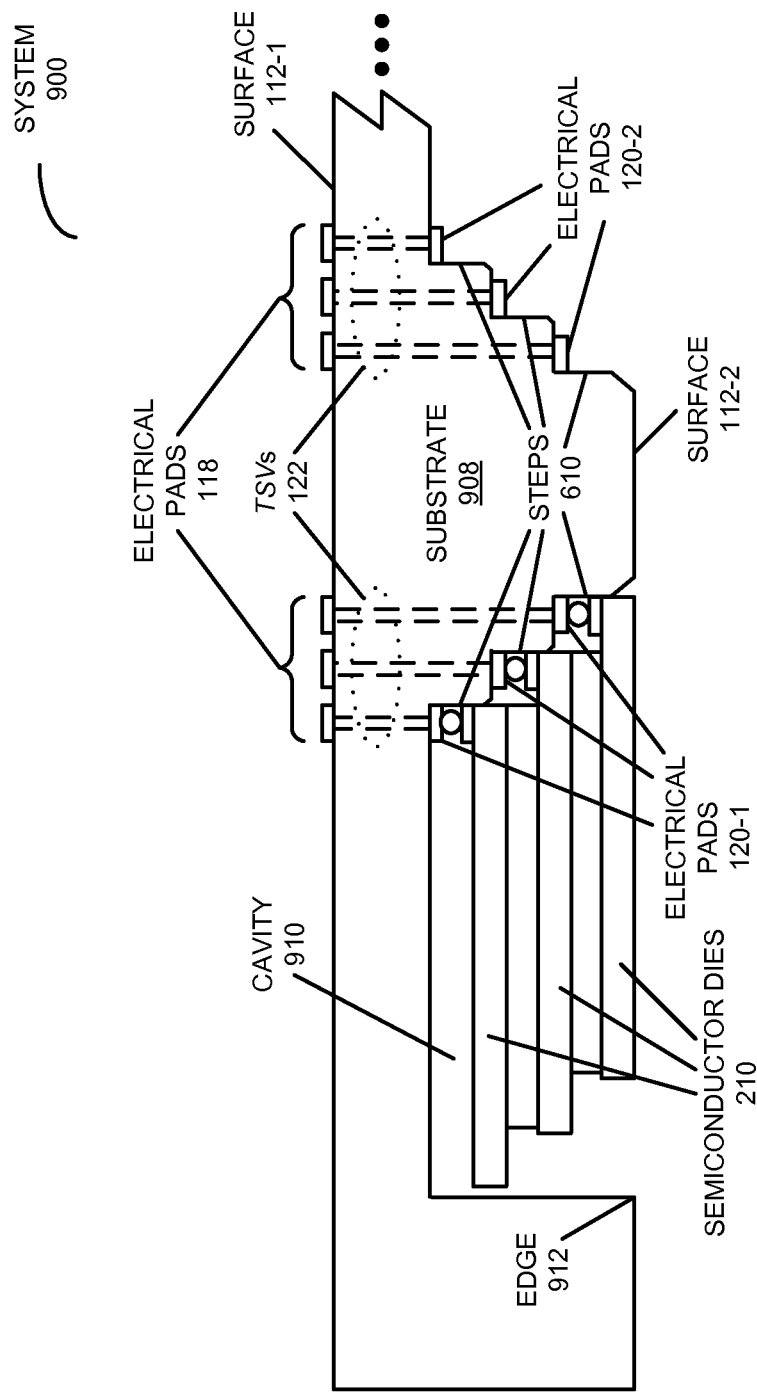
FIG. 9 is a block diagram illustrating a side view of a system that includes the chip package of FIG. 6 in accordance with an embodiment of the present disclosure.

The slanted or stairstep structure to interface with a ramp-stack-style chip stack may not be limited to the edge or side of the chip package. Cavities having slanted or stairstep sidewalls may also be included away from the side(s) of the substrate. This is illustrated in FIG. 9, which presents a block diagram illustrating a side view of system 900 that includes chip package 600 (FIG. 6). In particular, substrate 908 may include a cavity 910, defined by an edge 912, that partially surrounds set of semiconductor dies 210.

Figure 10:
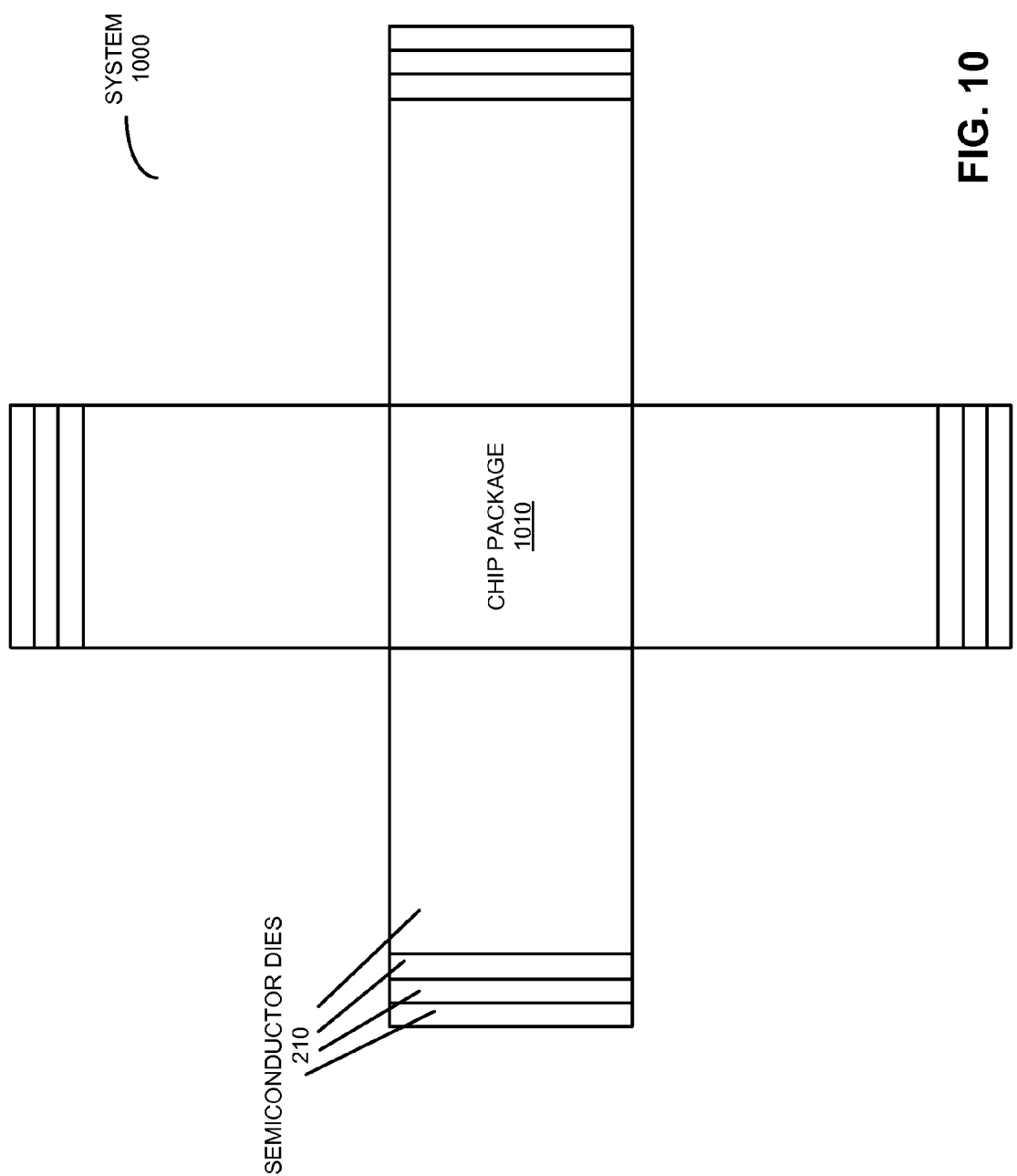
FIG. 10 is a block diagram illustrating a top view of a system that includes the chip package of FIG. 1 or 6 in accordance with an embodiment of the present disclosure.

The assembly technique described above can be scaled up so that multiple chip stacks may be assembled along the sides of a given substrate. A 4-way chip-stack assembly is shown in FIG. 10, which presents a block diagram illustrating a top view of system 1000 that includes chip package 1010, such as chip package 100 (FIG. 1) or 600 (FIG. 6). This assembly may allow each stack (such as each memory stack) to be in close proximity to an integrated circuit (such as integrated circuit 222 in FIG. 2), without needing to be associated with a single integrated circuit. Thus, a given stack may be partitioned so that it can be accessed by memory controllers on different semiconductor dies or, alternatively, an integrated circuit can be interfaced to multiple memory stacks.

While the preceding embodiments illustrate particular configurations of the chip package and the system, a number of techniques and configurations may be used to implement: electrical contact, mechanical alignment, assembly, and/or electrical I/O with the substrate. One alignment technique involves the use of etch pits in conjunction with balls in the etch pits to maintain relative alignment of semiconductor dies 210 (FIGS. 2 and 9) in the stack. The ball-and-etch-pit alignment technique can align the surfaces of semiconductor dies 210 and/or the substrate in FIGS. 2 and 9 with mechanical tolerances of less than a micron under slight pressure that snaps the surfaces together. Before applying this pressure, pick-and-place machines can be used to achieve mechanical tolerances of less than 10 μm when placing components together. With a little additional time (and resulting assembly cost), these machines can align the components with mechanical tolerances of less than a micron. Given these initial alignments, it is possible to then adhere semiconductor dies 210 (FIGS. 2 and 9) to form a spatially well-defined terrace among semiconductor dies 210 (FIGS. 2 and 9). In this example, it may be sufficient to align the substrate to semiconductor dies 210 (FIGS. 2 and 9).

For example, a minimal arrangement may use two pits to fix the x-y position of at least the one of sides 114 (FIGS. 1, 2 and 6) and semiconductor dies 210 (FIGS. 1, 2 and 6). A mechanical force applied to at least the one of sides 114 (FIGS. 2 and 9) and semiconductor dies 210 (FIGS. 2 and 9) would then press the substrate into contact with semiconductor dies 210 (FIGS. 2 and 9). However, thermal distortions and other mechanical forces may prevent a weakly adhesive technique from providing a robust long-term chip-packaging technique. While strong or permanent adhesion of the substrate and semiconductor dies 210 (FIGS. 2 and 9) is robust, it may prevent rework during assembly and test and/or after deployment. In general, packaging techniques that allow some rework are more cost-effective when faced with lower semiconductor-die yields or high expense to test extensively before packaging and assembly. Thus, there may be advantages to packaging techniques that avoid strong adhesives.

More generally, any combination of mechanically coupling (or compatible) positive and negative surface features on the substrate and semiconductor dies 210 (FIGS. 2 and 9) may align the components without or in combination with adhesives.

Note that in some embodiments electronic alignment techniques are used to correct for planar mechanical misalignments in the system. For example, electronic alignment may be used with conductive and/or capacitive contacts if a given electrical pad on one surface contacts an array of transmit or receive electrical pads on a facing surface.

In general, functions of the chip package and the system may be implemented in hardware and/or in software. Thus, the system may include one or more program modules or sets of instructions stored in an optional memory subsystem (such as DRAM or another type of volatile or non-volatile computer-readable memory), which may be executed by an optional processing subsystem. Note that the one or more computer programs may constitute a computer-program mechanism. Furthermore, instructions in the various modules in the optional memory subsystem may be implemented in: a high-level procedural language, an object-oriented programming language, and/or in an assembly or machine language. The programming language may be compiled or interpreted, e.g., configurable or configured, to be executed by the processing subsystem.

Components in the system may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, the system may be at one location or may be distributed over multiple, geographically dispersed locations.

Note that the system may include: a VLSI circuit, a switch, a hub, a bridge, a router, a communication system (such as a WDM communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Moreover, a given computer system may be at one location or may be distributed over multiple, geographically dispersed locations.

Furthermore, the embodiments of the chip package and/or the system may include fewer components or additional components. Although these embodiments are illustrated as having a number of discrete items, the chip package and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the chip package and/or the system may be implemented more in hardware and less in software, or less in hardware and more in software, as is known in the art.

While the preceding embodiments use semiconductor dies 210 in FIGS. 2 and 9 (such as silicon) in the system, in other embodiments a different material than a semiconductor may be used as the substrate material in one or more of these chips.

Note that the chip package may be fabricated using an additive or positive process (i.e., a material-deposition process) and/or a subtractive or negative process (i.e., a material-removal process). For example, the process may include: sputtering, plating, isotropic etching, anisotropic etching, a photolithographic technique and/or a direct-write technique. Additionally, these processes may utilize a wide variety of materials, including: a semiconductor, metal, glass, sapphire, an organic material, a ceramic material, a plastic and/or silicon dioxide.

Figure 11:
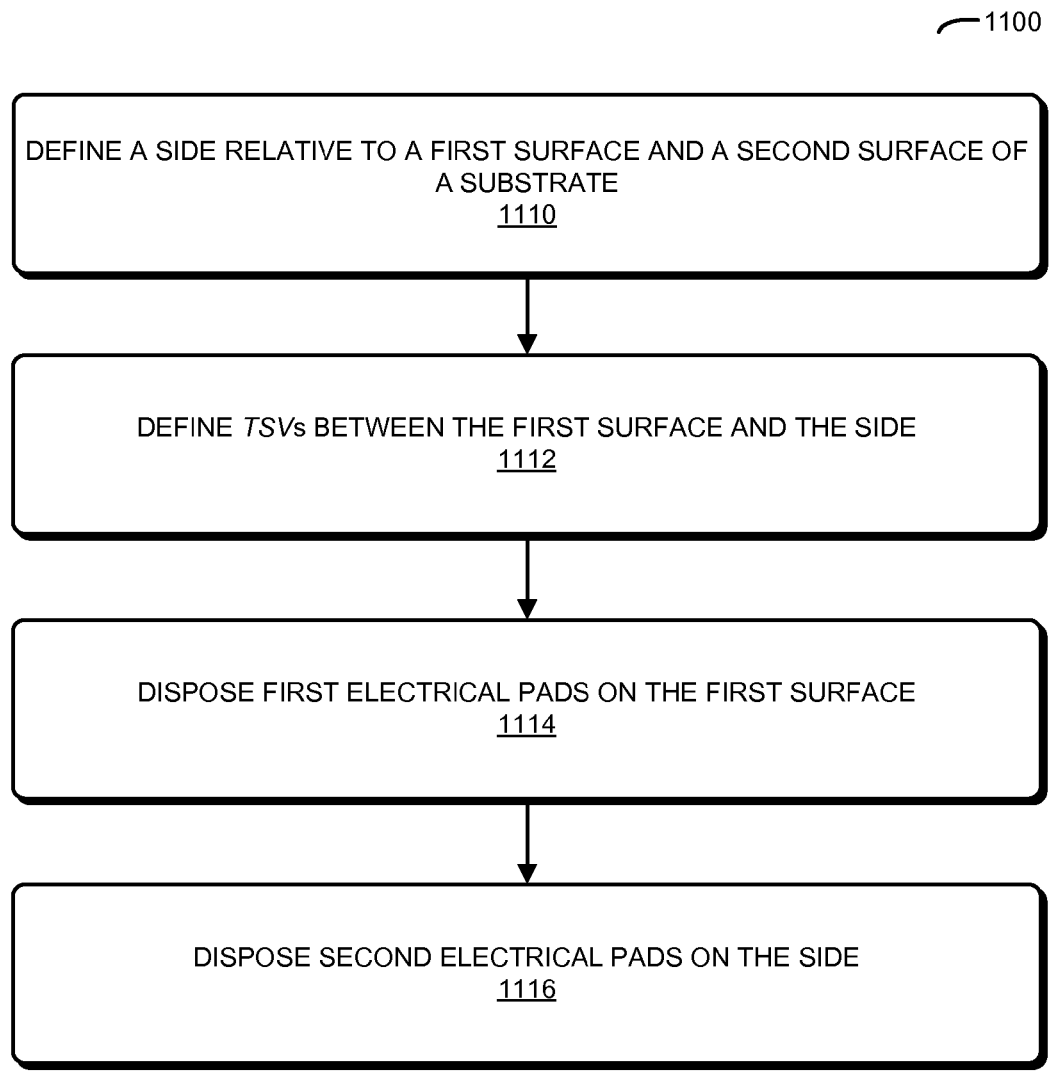
FIG. 11 is a flow chart illustrating a method for fabricating a chip package in accordance with an embodiment of the present disclosure.

We now describe the method. FIG. 11 presents a flow chart illustrating a method 1100 for fabricating a chip package, such as chip package 100 (FIG. 1) or 600 (FIG. 6). During this method, the side of the substrate is defined relative to the first surface and the second surface of the substrate (operation 1110), where the first surface and the second surface are substantially parallel, and where the side is at the angle relative to the plane of the first surface that is between that of a direction parallel to the first surface and that of a direction perpendicular to the first surface (i.e., between 0° and 90°). Then, TSVs are defined in the substrate between the first surface and the side (operation 1112). Moreover, the first electrical pads are disposed on the first surface (operation 1114), where the first electrical pads are electrically coupled to the TSVs. Furthermore, the second electrical pads are disposed on the side (operation 1116), where the second electrical pads are electrically coupled to the TSVs. Note that the given TSV electrically couples the given one of the first electrical pads and the given one of the second electrical pads. Additionally, the second electrical pads are configured to electrically couple to the set of semiconductor dies arranged in the stack in the direction, which is substantially perpendicular to the first surface. The semiconductor dies in the set of semiconductor dies are offset from each other in the horizontal direction in the plane of the first surface so that one side of the stack defines the stepped terrace.

In some embodiments of method 1100 there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A chip package, comprising:
a substrate having a first surface, a second surface and a side, wherein the first surface and the second surface are substantially parallel, and wherein the side is on a plane which is at an angle relative to a plane of the first surface, wherein the angle is between zero and 90 degrees;
first electrical pads disposed on the first surface;
second electrical pads disposed on the side; and
through-substrate vias (TSVs) electrically coupling the first electrical pads and the second electrical pads, wherein a given TSV electrically couples a given one of the first electrical pads and a given one of the second electrical pads;
wherein the second electrical pads are configured to electrically couple to a set of semiconductor dies arranged in a stack in a direction which is substantially perpendicular to the first surface; and
wherein the semiconductor dies in the set of semiconductor dies are offset from each other in a horizontal direction in the plane of the first surface so that one side of the stack defines a stepped terrace.

2. The chip package of claim 1, wherein the side includes discrete vertical steps corresponding to the stepped terrace.

3. The chip package of claim 1, wherein the TSVs are included in dicing lanes of a wafer that includes the substrate.

4. The chip package of claim 1, wherein the substrate further includes a cavity, defined by an edge, that is configured to partially surround the set of semiconductor dies.

5. The chip package of claim 1, wherein the substrate includes a material selected from the group consisting of: glass, a plastic, silicon and a ceramic.

6. The chip package of claim 1, wherein the first electrical pads are configured to electrically couple to an integrated circuit.

7. The chip package of claim 1, wherein the angle is fabricated using machining.

8. The chip package of claim 1, wherein the angle is fabricated using etching.

9. A system, comprising:
a substrate having a first surface, a second surface and a side, wherein the first surface and the second surface are substantially parallel, and wherein the side is on a plane which is at an angle relative to a plane of the first surface, wherein the angle is between zero and 90 degrees;
first electrical pads disposed on the first surface;
second electrical pads disposed on the side;
through-substrate vias (TSVs) electrically coupling the first electrical pads and the second electrical pads, wherein a given TSV electrically couples a given one of the first electrical pads and a given one of the second electrical pads; and
a set of semiconductor dies arranged in a stack in a direction which is substantially perpendicular to the first surface;
wherein the semiconductor dies in the set of semiconductor dies are offset from each other in a horizontal direction in the plane of the first surface so that one side of the stack defines a stepped terrace; and
wherein the second electrical pads are configured to electrically couple to the semiconductor dies in the set of semiconductor dies.

10. The system of claim 9, wherein the side includes discrete vertical steps corresponding to the stepped terrace.

11. The system of claim 9, wherein the TSVs are included in dicing lanes of a wafer that includes the substrate.

12. The system of claim 9, wherein the substrate further includes a cavity, defined by an edge, that partially surrounds the set of semiconductor dies.

13. The system of claim 9, wherein the substrate includes a material selected from the group consisting of: glass, a plastic, silicon and a ceramic.

14. The system of claim 9, wherein the system further includes an integrated circuit electrically coupled to the first electrical pads.

15. The system of claim 9, wherein the angle is fabricated using machining.

16. The system of claim 9, wherein the angle is fabricated using etching.

17. The system of claim 9, wherein the semiconductor dies are electrically coupled to the second electrical pads by solder.

18. The system of claim 9, wherein the semiconductor dies are electrically coupled to the second electrical pads by microsprings.

19. The system of claim 9, wherein the semiconductor dies are electrically coupled to the second electrical pads by an anisotropic conducting film.

20. A method of fabricating a chip package, wherein the method comprises:

defining a side of a substrate relative to a first surface and a second surface of the substrate, wherein the first surface and the second surface are substantially parallel, and wherein the side is on a plane which is at an angle relative to a plane of the first surface, wherein the angle is between zero and 90 degrees;

defining through-substrate vias (TSVs) in the substrate between the first surface and the side;

disposing first electrical pads on the first surface, wherein the first electrical pads are electrically coupled to the TSVs; and disposing second electrical pads on the side, wherein the second electrical pads are electrically coupled to the TSVs;

wherein a given TSV electrically couples a given one of the first electrical pads and a given one of the second electrical pads;

wherein the second electrical pads are configured to electrically couple to a set of semiconductor dies arranged in a stack in a direction which is substantially perpendicular to the first surface; and wherein the semiconductor dies in the set of semiconductor dies are offset from each other in a horizontal direction in the plane of the first surface so that one side of the stack defines a stepped terrace.

* * * * *

UNITED STATES PATENT AND TRADEMARK OFFICE
CERTIFICATE OF CORRECTION

| | | |
|---|---|---|
| PATENT NO. | : 8,975,754 B2 | Page 1 of 1 |
| APPLICATION NO. | : 13/764331 | |
| DATED | : March 10, 2015 | |
| INVENTOR(S) | : Thacker et al. | |

It is certified that error appears in the above-identified patent and that said Letters Patent is hereby corrected as shown below:

Specification

In column 3, line 27, delete "0° and) 90°." And insert -- 0° and 90°). --, therefor.

Signed and Sealed this
Twentieth Day of October, 2015

Michelle K. Lee
*Director of the United States Patent and Trademark Office*